United States Patent
Chen et al.

(10) Patent No.: US 11,408,924 B2
(45) Date of Patent: Aug. 9, 2022

(54) METHOD FOR FAULT LOCATION TO MULTI-TERMINAL TRAVELING WAVE IN DIRECT CURRENT DISTRIBUTION LINE

(71) Applicant: Shandong University of Technology, Zibo (CN)

(72) Inventors: Yu Chen, Zibo (CN); Jinghua Wang, Zibo (CN); Bingyin Xu, Zibo (CN); Ke Peng, Zibo (CN); Wei Wang, Zibo (CN)

(73) Assignee: Shandong University of Technology, Zibo (CN)

( * ) Notice: Subject to any disclaimer, the term of this patent is extended or adjusted under 35 U.S.C. 154(b) by 0 days.

(21) Appl. No.: 17/013,879

(22) Filed: Sep. 8, 2020

(65) Prior Publication Data
US 2021/0156899 A1 May 27, 2021

(30) Foreign Application Priority Data
Nov. 25, 2019 (CN) .......................... 201911165839.X

(51) Int. Cl.
*G01R 31/08* (2020.01)
*G01R 31/11* (2006.01)

(52) U.S. Cl.
CPC ......... *G01R 31/085* (2013.01); *G01R 31/088* (2013.01); *G01R 31/11* (2013.01)

(58) Field of Classification Search
CPC .................................................. G01R 31/085
See application file for complete search history.

(56) References Cited

U.S. PATENT DOCUMENTS

| | | | | |
|---|---|---|---|---|
| 4,313,169 A * | 1/1982 | Takagi | ................... | H02H 7/265 |
| | | | | 324/522 |
| 6,988,042 B2 * | 1/2006 | Choi | ................... | G01R 31/088 |
| | | | | 324/509 |
| 2015/0226780 A1 * | 8/2015 | Sun | ...................... | G01R 31/086 |
| | | | | 702/59 |

* cited by examiner

*Primary Examiner* — Hyun D Park
(74) *Attorney, Agent, or Firm* — Idea Intellectual Limited; Margaret A. Burke; Sam T. Yip

(57) ABSTRACT

A method for fault location to multi-terminal traveling wave in a direct current distribution line, which belongs to the field of power line fault ranging and location technology. The method includes a main site and a plurality of acquisition points installed into the distribution line and includes steps as follows. Step 1001: collecting and uploading a traveling wave signal by each of the acquisition points after a fault occurs in the line; step 1002: generating a fault record set; step 1003: computing the shortest paths from a central site to other sites and their lengths; step 1004: using expanded two-terminal traveling wave ranging principle for pairing computation; step 1005: converting positions of possible disturbance points into possible disturbance occurrence time points; step 1006: extrapolating from equal path lengths of the possible disturbance points to obtain disturbance time data; and step 1007: determining a final disturbance point.

7 Claims, 4 Drawing Sheets

METHOD FOR FAULT LOCATION TO MULTI-TERMINAL TRAVELING WAVE IN DIRECT CURRENT DISTRIBUTION LINE

CROSS-REFERENCES TO RELATED APPLICATIONS

This application claims priority to the Chinese patent application No. 201911165839.X filed on Nov. 25, 2019, and the disclosures of which are incorporated herein by reference in their entirety.

FIELD OF THE INVENTION

The invention relates to a method for fault location to multi-terminal traveling wave in a direct current distribution line, which belongs to the field of power line fault ranging and location technology.

BACKGROUND OF THE INVENTION

With the development of power-and-electronic technology, direct current (DC) distribution line is more efficient than alternating current (AC) distribution line when it is connected to a distributed power supply to supply a DC load. Accordingly, technology in DC distribution networks and applications thereof have attracted attention, and distribution networks in the future will become hybrid distribution networks constructed by AC and DC distribution lines. When AC-and-DC hybrid distribution lines fail, reliable and accurate fault location plays an important role in timely repairing line faults and ensuring stable operation for a distribution system.

DC distribution networks at present generally do not separately exist but support each other with AC distribution networks. For each DC distribution network, because it is connected to AC systems and power supplies of user terminals via inverters, the total number of line topology nodes thereof are not too many.

As an accurate fault location technology, methods for fault ranging to traveling wave have been widely used in power systems. Since a topology structure of high voltage DC lines is mainly a point-to-point structure, its traveling wave ranging system is arranged in accordance with double-terminal traveling wave ranging of the lines. When using a two-terminal method for fault ranging, the ranging may fail once an unexpected situation occurs across traveling wave acquisition devices at one-side sites.

SUMMARY OF THE INVENTION

The technical problem to be solved by the present invention is how to overcome the shortcomings of the prior art. A method for fault location to multi-terminal traveling wave in a direct current (DC) distribution line is provided by using traveling wave data of multiple sites, which effectively avoids ranging failure resulted from abnormality and non-startup of a traveling wave fault location device of sites in the DC distribution line, thereby enhancing reliability of a traveling wave ranging system.

The technical solutions provided by the present invention for solving the technical problems include a method for fault location to multi-terminal traveling wave in a DC distribution line, installed with a main site and a plurality of acquisition points into the distribution line. Each of the acquisition points is installed with a traveling wave monitoring site. All the acquisition points are connected to the main site via a communication network. The distribution line is installed with the plurality of acquisition points, and the plurality of acquisition points have data to locate a fault point F. The method is characterized by including steps as follows.

Step 1001: collecting and uploading a traveling wave signal by each of the acquisition points after a fault occurs in the line;

step 1002: collecting fault traveling wave data which is acquired through each of the acquisition points by the main site, in which the main site performs selection for generating a fault record set, and traveling wave records of the sites are sorted out to generate the fault record set by taking traveling wave propagation time points corresponding to the maximum distances between the sites of the DC distribution line as sorting values;

step 1003: defining the acquisition point where the traveling wave signal is first detected as a central site and then computing the shortest paths from the central site to other sites and their lengths, in the fault record set generated in the step 1002;

step 1004: using a shortest-path matrix $P^{(k)}$ and a shortest-distance matrix $D^{(k)}$ for the sites within an effective area in a traveling wave network, which are obtained by computation in the step 1003, for pairing computation with respect to arrival time points of initial traveling wave;

step 1005: converting positions of possible disturbance points into possible disturbance occurrence time points;

step 1006: extrapolating from equal path lengths of the possible disturbance points to obtain disturbance time data; and Step 1007: computing and comparing Manhattan distances between traveling wave data of acquisition points and actual records, so as to determine a final disturbance point.

In preferred embodiments, in the step 1003, computing the shortest paths from the central site to other sites and their lengths includes:

step 1003-1: taking line lengths as weight to construct a weighted adjacency matrix A of a power network, and obtaining an initial distance matrix $D^{(0)} = (d_{ij}^{(0)}) = A$ and an initial shortest-path matrix $P^{(0)} = (a_{ij}^{(0)})$, wherein:

$$d_{ij}^{(0)} \begin{cases} d_{ij}, \text{ where } i \text{ and } j \text{ are consecutive} \\ \infty, \text{ where } i \text{ and } j \text{ are non-consecutive} \end{cases} (i, j = 1, 2 \ldots n);$$

$$a_{ij}^{(0)} \begin{cases} \phi, \text{ where } i \text{ and } j \text{ are consecutive} \\ -, \text{ where } i \text{ and } j \text{ are non-consecutive} \end{cases} (i, j = 1, 2 \ldots n);$$

step 1003-2: computing an iteration for the matrix $D^{(k)} = (d_{ij}^{(k)})$ and the shortest-path matrix $P^{(k)} = (a_{ij}^{(k)})$, where:

$$d_{ij}^{(k)} = \min\{d_{ij}^{(k-1)}, d_{ir}^{(k-1)} + d_{rj}^{(k-1)}\}, (r=1,2,\ldots,n);$$

accordingly, if $d_{ij}^{(k)} = d_{il}^{(k-1)} + d_{lj}^{(k-1)}$, a site $v_l$ is recorded such and that:

$$a_{ij}^{(k)} = \{a_{il}^{(k-1)}, v_l, a_{lj}^{(k-1)}\},$$

which indicates that a path length from a site $v_i$ to a site $v_j$ becomes shorter after passing by the site $v_l$, otherwise $a_{ij}^{(k)} = a_{ij}^{(k-1)}$; and step 1003-3: ending the iteration if $D^{(k)} = D^{(k-1)}$.

In preferred embodiments, in the step 1005, converting the positions of the possible disturbance points into the possible disturbance occurrence time points is computed by a formula as:

$$t_{fi} = T_a - \frac{X_{ABF}}{v} = \frac{1}{2}(T_a + T_d - T_{abcd})$$

where v is wave velocity along the line, $X_{ABF}$ is a distance from a site A to the fault point F; $T_a$ and $T_d$ are the arrival time points of the traveling wave recorded at the site A and a site D, $T_{abcd}$ is propagation time of the traveling wave passing by the sites A, B, C, D along a path, and $t_{fi}$ is a position of an i-th possible disturbance point figured out by computation.

In preferred embodiments, in the step 1004, the pairing computation with respect to the arrival time points of the initial traveling wave is computed by:

Bringing the arrival time points and the distances of the initial traveling wave of disturbance of two pairs of the acquisition points into computation, so as to obtain a result set of the possible disturbance points, which is based on an expanded two-terminal traveling wave ranging principle;

where time points when an initial wavefront of the traveling wave arrives at sites A, B, C, and D are Ta, Tb, Tc, and Td, respectively, and a formula for computation is as follows:

$$\begin{cases} X_{ABF} = \frac{1}{2}[(T_a - T_d) \cdot v + L_{ABCD}] \\ X_{DCF} = \frac{1}{2}[(T_d - T_a) \cdot v + L_{ABCD}] \end{cases},$$

where $L_{ABCD}$ is the length of the line passing by the sites A, B, C, and D along the path; v is wave velocity along the line; $X_{ABF}$ is a distance from the site A to the fault point F; $X_{DCF}$ is a distance from the site D to the fault point F, $T_a$ and $T_d$ are the arrival time points of the traveling wave recorded at the sites A and D.

In preferred embodiments, in the step 1006, extrapolating from the equal path lengths of the possible disturbance points to obtain disturbance time data includes: queuing and sorting the possible occurrence time points of the disturbance, wherein the possible occurrence time points which have a time difference therebetween less than 3 us are regarded as the same time point, three earliest time points $t_{f0}$, $t_{f1}$, and $t_{f2}$ in the possible disturbance time points are taken as source vertices, such that three sets of traveling wave arrival record data of the traveling wave acquisition points are obtained by extrapolation from the equal path length of each possible path.

In preferred embodiments, the computation process for obtaining the three sets of the traveling wave arrival record data of the traveling wave acquisition points by extrapolation from the equal path length of each possible path includes Step 1006-1: defining an initial state of the DC distribution network graph as that all vertices have not been accessed and defining coloring values of all the vertices as being white so as to set a coloring value of the computed disturbance point F as gray;

Step 1006-2, finding all adjacent vertices having white coloring values from a vertex having a gray coloring value, and comparing path lengths between the found adjacent vertices and the disturbance point F, wherein if a white vertex v which is adjacent to a vertex u having a gray coloring value at present satisfies:

$$d_{vF} = \min\{d_{iF} + d_{ij}\}, (i=1, \ldots, n; j=1, \ldots, m),$$

the vertex v is colored as gray, wherein if there is no other white point adjacent to the vertex u, the coloring is gray and the arrival time point of propagation of the initial traveling wave of the disturbance is recorded, wherein n in the formula of the step 1006-2 is the number of gray vertices, m in the formula of the step 1006-2 is the number of white vertices corresponding to a gray vertex, and a cumulative path length from the vertices v to the fault point F is simultaneously recorded for the next search; and Step 1006-3: repeating the step 1006-2 until all DC distribution network nodes are accessed.

In preferred embodiments, the Manhattan distances are computed by:

$$LM_k = \sum_{j=1}^{n} |t_{fij} - t_{rj}|,$$

where $t_{fij}$ is the arrival time point of the traveling wave at the j-th node obtained by extrapolation from the equal path length according to a source vertex which is set by the possible disturbance occurrence time point, and $t_{rj}$ is the arrival time point of the initial traveling wave of the disturbance recorded by a traveling wave acquisition point, wherein if a distance corresponding to a time difference of three or two earliest time points is less than 0.2 km, a bus is considered as a disturbance point.

As compared with the prior art, the present invention has the following advantages:

1. In the method for fault location to multi-terminal traveling wave in a DC distribution line, traveling wave data of multiple sites is used, which effectively avoids ranging failure resulted from abnormality and non-startup of a traveling wave fault location device of sites on the DC distribution line, thereby enhancing reliability of a traveling wave ranging system.

2. In the method for fault location to multi-terminal traveling wave in a DC distribution line, only the traveling wave data is used, and it does not depend on protection data. Therefore, it is suitable not only for the fault location in tripping protection but also for locating to line disturbance which has not caused tripping protection, and thus the method is widely applicable. By analyzing and locating the line disturbance, weak points can be found before a DC distribution line fault occurs, so as to prevent unexpected situations and improve power supply reliability of the line.

3. There are many topologies in DC distribution lines. The method is based on the multi-terminal traveling wave data and the weighted adjacency matrix, which can be used in different topologies.

4. After the fault occurs in the DC distribution line, the initial traveling wave of the fault will travel along the DC distribution line to the whole DC distribution network, and using the multi-terminal data can avoid ranging failure caused by abnormality of equipments at one side in a double-terminal method. Therefore, in the present invention, after the fault occurrence, the traveling wave signals collected from multiple traveling wave acquisition points in the whole small DC distribution network can be used for traveling wave fault location. As the cost of construction and operation of traveling wave acquisition devices and communication channels gradually reduces, the method improves reliability and accuracy of the fault location for fully applying the multi-terminal fault traveling wave data.

After the fault occurs in the DC distribution line, the initial traveling wave of the fault will travel along the line to the line sites on both sides and then continue to travel to the adjacent sites when the fault point exists. By recording the traveling wave data arriving at these sites, the method can be used for backup and result credibility verification of double-terminal ranging of the line.

For the line disturbance which has not caused protection, the disturbed line can be determined and accurately located by the method. The disturbance points on the line would be insulated weak points in general. Power departments can focus on an inspection of disturbance points when planning maintenance, which can prevent unexpected situations, so as to reduce the possibility of DC distribution line fault as much as possible and to change passive fault maintenance into active planning maintenance.

DETAILED DESCRIPTION

Figure 1:
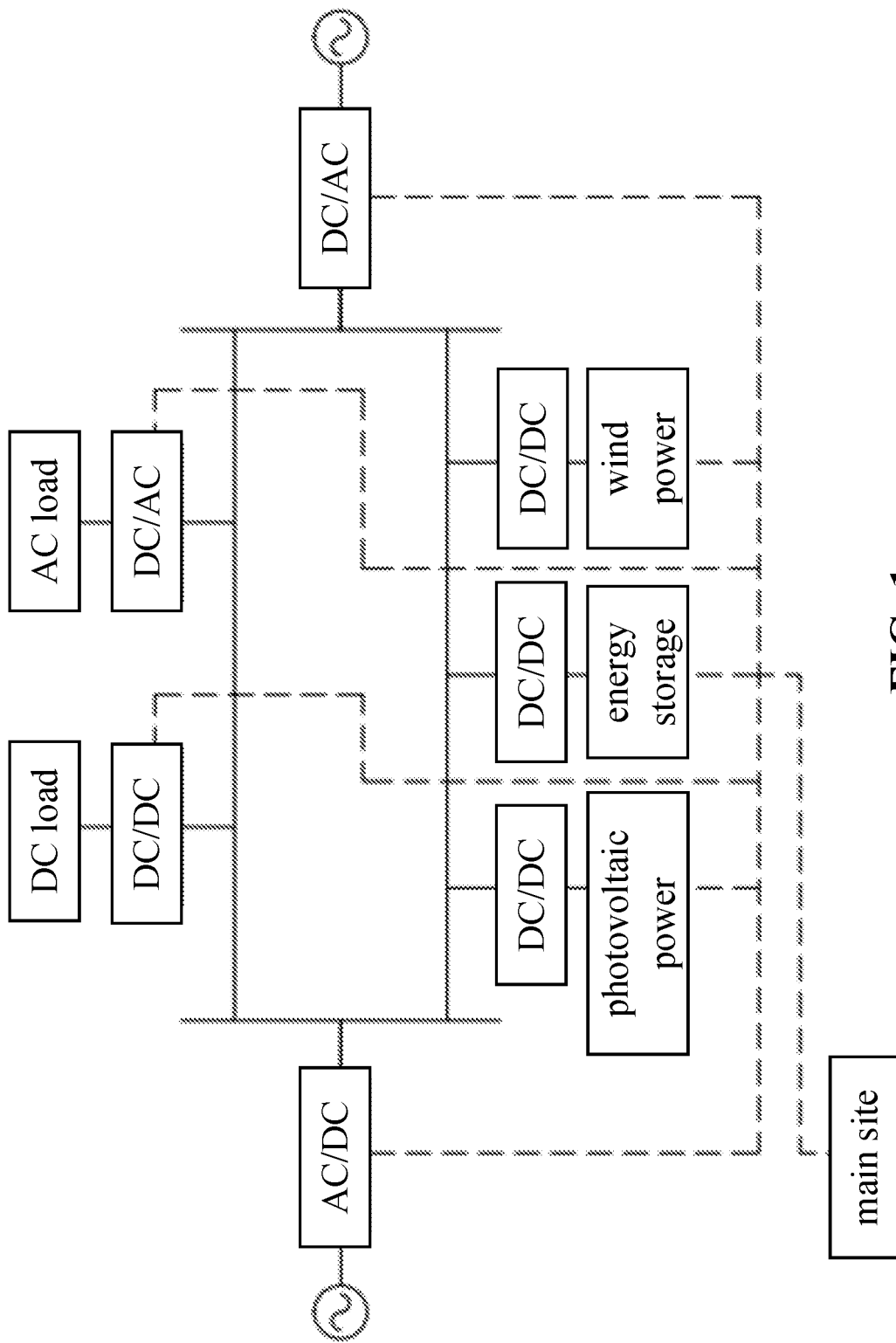
FIG. 1 is a schematic diagram of a multi-terminal traveling wave fault ranging system for direct current (DC) distribution lines.
Figure 2:
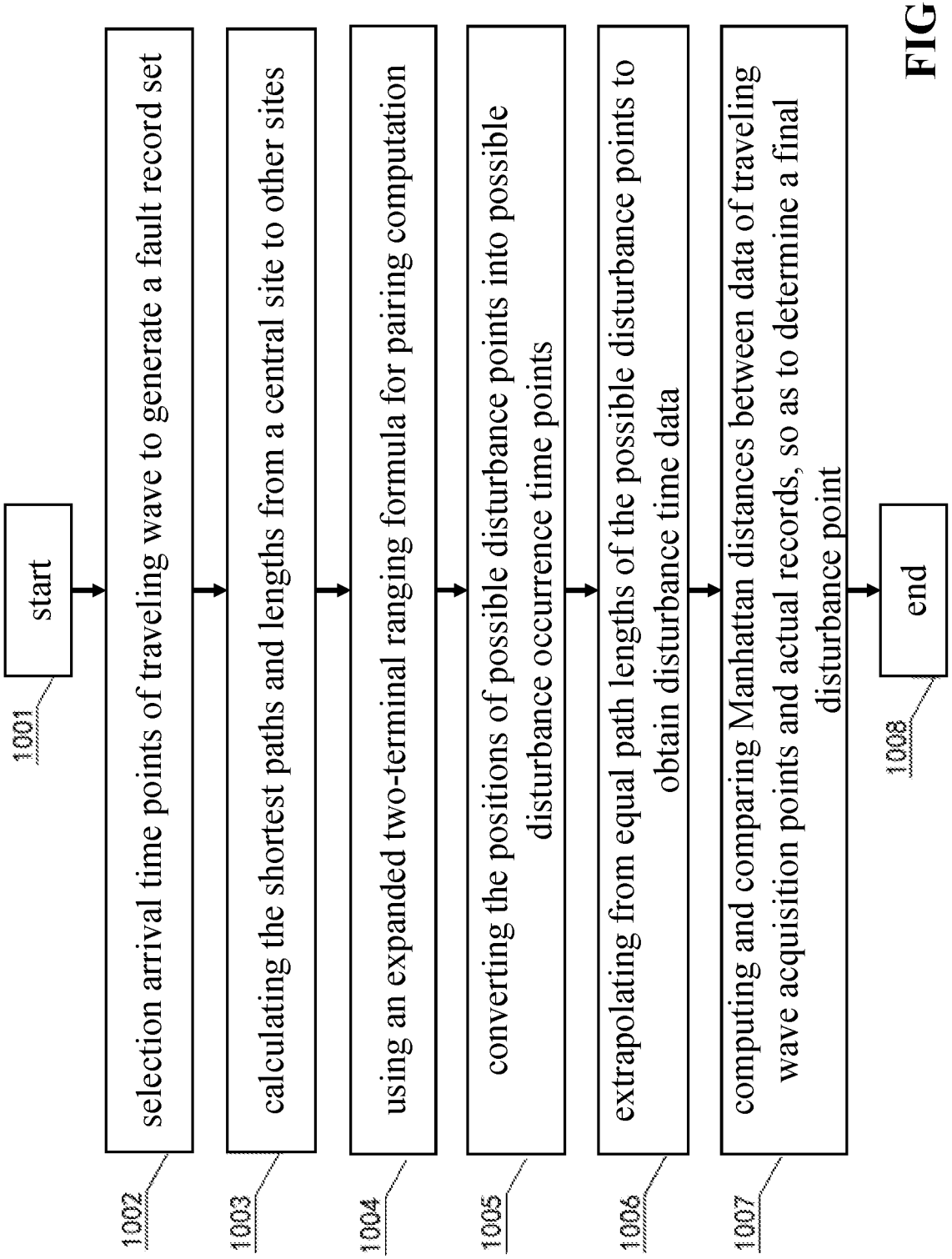
FIG. 2 is a flowchart of a fault ranging algorithm to multi-terminal traveling wave for DC distribution lines.
Figure 3:
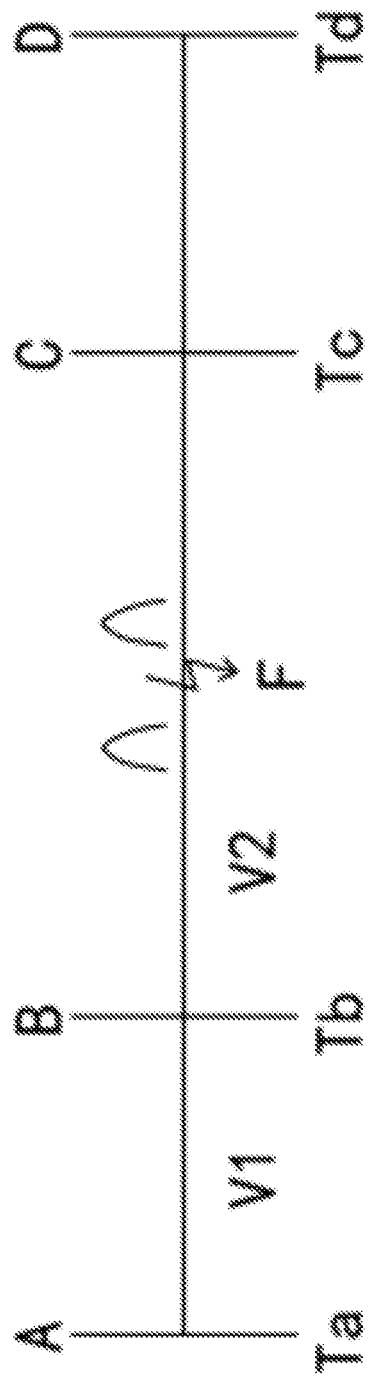
FIG. 3 is a schematic diagram of expanding on double-terminal ranging principle.

FIGS. 1-3 are the best embodiments of the present invention. The following are in combination with FIGS. 1-3 to further explain the present invention.

In a multi-terminal traveling wave fault ranging system of direct current (DC) distribution lines as shown in FIG. 1, alternating current (AC) transmission lines are connected to DC distribution lines via an AC-DC conversion system, and the DC distribution lines are also connected to AC distribution lines via a DC-AC conversion system. In the DC distribution lines, power is supplied to a DC load by connecting the DC-DC conversion system and the DC load. Also, power is supplied to an AC load by connecting the DC-AC conversion system and the AC load. A photovoltaic power generation system, an energy storage system, and a wind power generation system are also respectively connected to the DC distribution lines via the DC-DC conversion system, and DC power generated by electric power generation is fed into the DC distribution lines.

The AC-DC conversion system, the DC-AC conversion system, and the DC-DC conversion system as afore-mentioned can serve as sites, respectively. At each site, a traveling wave signal detection device and a time synchronization device are installed. Each site is connected to a main site via a communication network, and a communication system is applied to realizing traveling wave signal collection and uploading. Moreover, the detection device can be achieved by many forms, such as a composite device which can record traveling wave waveform of fault or a simple device which only records trigger time of traveling wave of fault. In the present invention, since there is high demand for time precision of a site apparatus, which addresses to microsecond level, time synchronization technology by GPS global positioning system or BeiDou system is applied in general. The communication network can be industrial Ethernet, optical Ethernet, EPON network, or private network.

As shown in FIG. 2, a fault ranging algorithm to multi-terminal traveling wave in a DC distribution line includes steps as follows:

Step 1001: start;

after a fault occurs in a line, each site serves as an acquisition point to collect and upload a traveling wave signal.

Step 1002: generating a fault record set by selecting out arrival time points of traveling wave;

fault traveling wave data acquired by each site (i.e. acquisition point) is acquired through a main traveling wave ranging site. First, the main site performs selection for generating a fault record set. By taking traveling wave propagation time points corresponding to the maximum distances between the sites of the DC distribution line as sorting values, traveling wave records of the sites are sorted out to generate the fault record set.

Step 1003: calculating the shortest paths and lengths from a central site to other sites;

in the fault record set generated in the step 1002, by defining a site (i.e. acquisition point) where the traveling wave signal is first detected as the central site, the shortest paths from the central site to other sites and their lengths are computed. The computation includes steps as follows.

Step 1003-1: taking the line lengths as weight to construct a weighted adjacency matrix A of a power network, and obtaining an initial distance-matrix $D^{(0)}=(d_{ij}^{(0)})=A$ and an initial shortest-path matrix $P^{(0)}=a_{ij}^{(0)})$, in which:

$$d_{ij}^{(0)} = \begin{cases} d_{ij}, \text{ where } i \text{ and } j \text{ are consecutive} \\ \infty, \text{ where } i \text{ and } j \text{ are non-consecutive} \end{cases} (i, j = 1, 2 \ldots n);$$

$$a_{ij}^{(0)} = \begin{cases} \phi, \text{ where } i \text{ and } j \text{ are consecutive} \\ -, \text{ where } i \text{ and } j \text{ are non-consecutive} \end{cases} (i, j = 1, 2 \ldots n).$$

Step 1003-2: computing an iteration of the matrix $D^{(k)}=(d_{ij}^{(k)})$ and the shortest-path matrix $P^{(k)}=(a_{ij}^{(k)})$, in which:

$$d_{ij}^{(k)}=\min \{d_{ij}^{(k-1)}, d_{ir}^{(k-1)}+d_{rj}^{(k-1)}\}, (r=1,2,\ldots,n);$$

Accordingly, if a comparison in the above equation is found as $d_{ij}^{(k)}=d_{il}^{(k-1)}+d_{lj}^{(k-1)}$, a site $v_l$ is recorded. That is:

$$a_{ij}^{(k)}=\{a_{il}^{(k-1)}, v_l, a_{lj}^{(k-1)}\},$$

which indicates that a path length from a site $v_i$ to a site $v_j$ becomes shorter after passing by the site $v_l$, otherwise $a_{ij}^{(k)}=a_{ij}^{(k-1)}$.

Step 1003-3: if $D^{(k)}=D^{(k-1)}$ ending the iteration. So far, the shortest paths and their distances between all the sites are obtained.

Step 1004: using an expanded two-terminal ranging formula for pairing computation;

the shortest-path matrix $P^{(k)}$ and the shortest-distance matrix $D^{(k)}$ for the sites within an effective area in a traveling wave network, which are obtained by the computation in the step 1003, are used for the pairing computation with respect to the arrival time points of initial traveling wave;

Based on the expanded two-terminal traveling wave ranging principle, the arrival time points and the distances of the initial traveling wave of the disturbance of two pairs of the acquisition points are brought to computation, so as to obtain a result set of possible disturbance points. The expanded two-terminal traveling wave ranging principle is depicted as FIG. 3. In a case of fault occurrence at point F between a line BC, time points when an initial wavefront of the traveling wave arrives at sites A, B, C, and D are Ta, Tb, Tc, and Td, respectively, and a formula for computation is as follows:

$$\begin{cases} X_{ABF} = \frac{1}{2}[(T_a - T_d) \cdot v + L_{ABCD}] \\ X_{DCF} = \frac{1}{2}[(T_d - T_a) \cdot v + L_{ABCD}] \end{cases},$$

where $L_{ABCD}$ is the length of the line passing by the sites A, B, C, and D; v is the wave velocity along the line; $X_{ABF}$ is the distance from the site A to the fault point F; $X_{DCF}$ is the distance from the site D to the fault point F. $T_a$ and $T_d$ are the arrival time points of the traveling wave recorded at the sites A and D. Similarly, the arrival time points of the initial traveling wave of the fault with respect to the sites A and C or the sites B and D also can be used to compute for obtaining the fault point.

Step 1005: converting the positions of the possible disturbance points into possible disturbance occurrence time points;

the computation formula is as follows:

$$t_{fi} = T_a - \frac{X_{ABF}}{v} = \frac{1}{2}(T_a + T_d - T_{abcd})$$

where v is the wave velocity along the lines, $X_{ABF}$ is the distance from the site A to the fault point F; $T_a$ and $T_d$ are the arrival time points of the traveling wave recorded at the sites A and D. $T_{abcd}$ is the propagation time of the traveling wave passing by the sites A, B, C, D along the path. $t_{fi}$ is a position of an i-th possible disturbance point figured out by the computation.

Step 1006: extrapolating from equal path lengths of the possible disturbance points to obtain disturbance time data; possible occurrence time points of the disturbance are queued and sorted. If a time difference between the possible occurrence time points of the disturbance is less than 3 us, these possible occurrence time points would be regarded as the same time point. Three earliest time points $t_{f0}$, $t_{f1}$, and $t_{f2}$ in the possible disturbance time points are taken as source vertices, and three sets of traveling wave arrival record data of the traveling wave acquisition points are obtained by extrapolation from the possible disturbance points by the possible path length in each possible path, which is computed as follows.

Step 1006-1: defining an initial state of the DC distribution network graph as that all vertices have not been accessed. That is, coloring values of all the vertices are white. The coloring value of the computed disturbance point F is set as gray.

Step 1006-2: finding all adjacent vertices having white coloring values from a vertex having a gray coloring value, and comparing path lengths between the found adjacent vertices and the disturbance point F. If a white vertex v which is adjacent to a vertex u having a gray coloring value at present satisfies:

$$d_{vF} = \min\{d_{iF} + d_{ij}\}, (i=1,\ldots,n; j=1,\ldots,m),$$

the vertex v is colored as gray. If there is no other white point adjacent to the vertex u, the coloring is gray and the arrival time point of propagation of initial traveling wave of the disturbance is recorded. In the above formula, n is the number of gray vertices, and m is the number of white vertices corresponding to a gray vertex. A cumulative path length from the vertices v to the fault point F is simultaneously recorded for the next search.

Step 1006-3: repeating the step 1006-2 until all DC distribution network nodes are accessed.

Step 1007: computing and comparing Manhattan distances between the traveling wave data of the acquisition points and actual records, so as to determine a final disturbance point;

with taking the three sets of the traveling wave arrival record data of the traveling wave acquisition points, which are obtained in the step 1006 by using the three earliest time points $t_{f0}$, $t_{f1}$, and $t_{f2}$ in the possible disturbance time points, the Manhattan distances between the three sets of data of the traveling wave acquisition points and the actual records are computed and compared. Which has the minimum distance is the time when the real disturbance occurs, and the position of the disturbance point corresponding to it is the disturbance position of that disturbance. The Manhattan distance is computed as follows:

$$LM_k = \sum_{j=1}^{n}|t_{fij} - t_{rj}|,$$

where $t_{fij}$ is the arrival time point of the traveling wave at the j-th node which is obtained by extrapolation from the equal path length according to the source vertex which is set as the possible disturbance occurrence time point, and $t_{rj}$ is the arrival time point of the initial traveling wave of the disturbance recorded by the traveling wave acquisition point. For example, if the distance corresponding to the time difference of the earliest three or two time points is less than 0.2 km, the bus is considered as the disturbance point.

Figure 4:
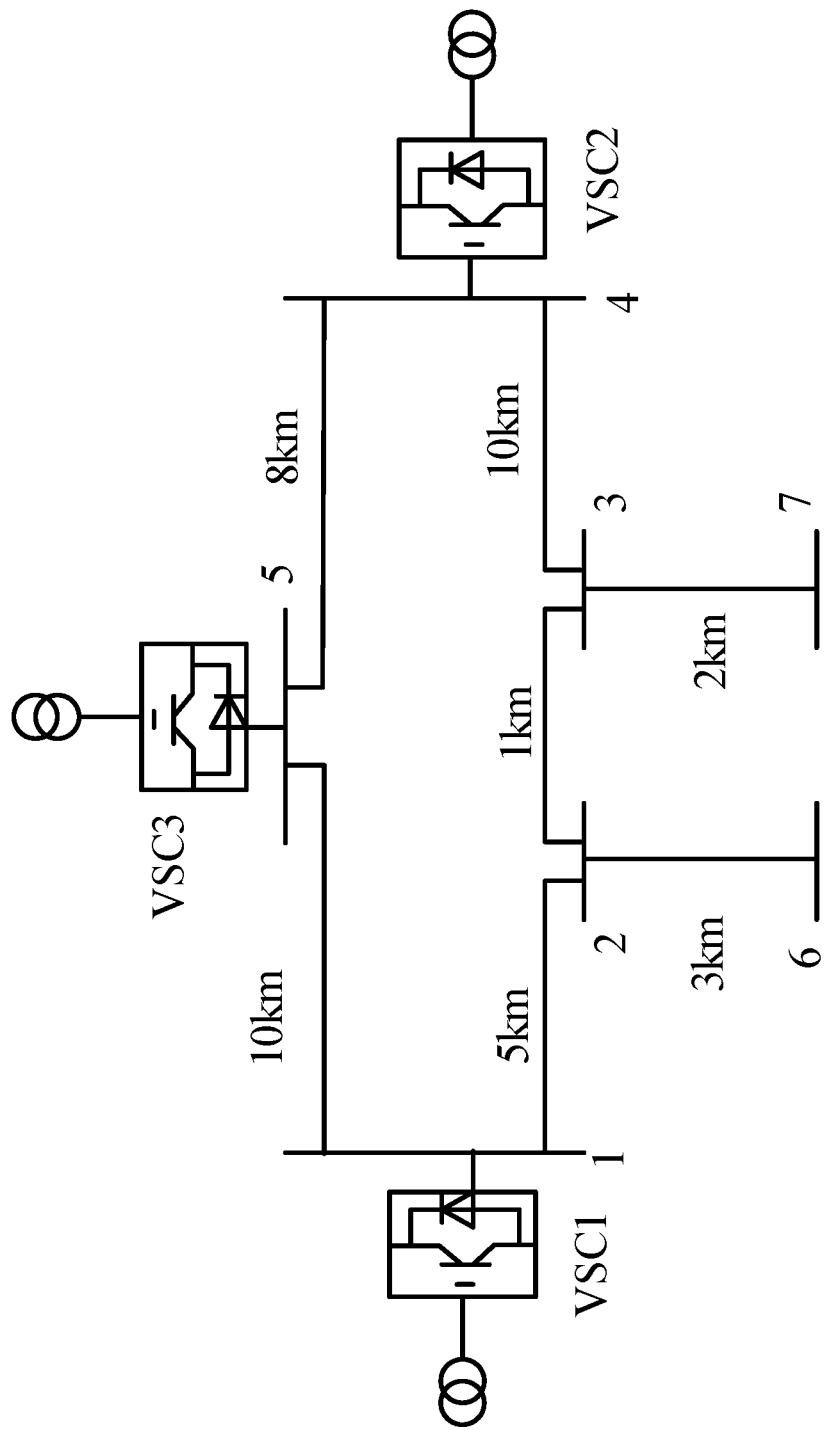
FIG. 4. Shows network topology and line lengths of a DC distribution network in three-terminal ring.

A ±10 kV DC distribution network in three-terminal ring is taken as an example, in which network topology and line lengths are shown in FIG. 4. The line is assumed as a cable line, and the propagation speed of the traveling wave in the line is 189.4 m/us. Traveling wave detection devices are installed into node 1 to node 7, so as to collect traveling wave signals.

PSCAD is used for establishing the corresponding simulation model. When the fault occurs at 400 m from the node 2 in a line 2-3 between the nodes 2 and nodes 3, the fault occurrence time is set as 0.01 ms and the time of initial traveling wave of the fault arriving at each measuring point is shown in Table 1.

TABLE 1

| Arrival time of initial traveling wave of fault | |
|---|---|
| node | time/μs |
| 1 | 38.5 |
| 2 | 12.1 |
| 3 | 13.1 |
| 4 | 65.9 |
| 5 | 91.3 |
| 6 | 27.9 |
| 7 | 23.7 |

Step 1001: after a fault occurs in a line, collecting and uploading a traveling wave signal by each acquisition point;

Step 1002, after a main site collects data, performing selection to a disturbance record set. By taking traveling wave propagation time points corresponding to the maximum distances between the sites in the DC distribution line as sorting values, the traveling wave records of the sites are selected out to generate the fault record set; in this example, from Table 1, it can be found that the arrival time point of the initial traveling wave of the fault recorded by the node 2 is the minimum, so $t_2$ serves as $t_{min}$. The preset threshold value can be set as $t_{set}=38000/189\approx201$ us. According to a formula $t_i-t_{min}\leq t_{set}$, data selection is performed so as to select out the data in the table.

Step 1003: in the disturbance record set generated in the step 1002, by setting an acquisition point where the traveling wave signal is first detected as a central site, computing the shortest paths from the central site to other sites and their lengths. In this example, the node 2 is the acquisition point where the traveling wave signal is first detected.

According to the network topology, the adjacency matrix A is:

$$A = \begin{bmatrix} 0 & 5 & \infty & \infty & 10 & \infty & \infty \\ - & 0 & 1 & \infty & \infty & 3 & \infty \\ - & - & 0 & 10 & \infty & \infty & 2 \\ - & - & - & 0 & 8 & \infty & \infty \\ - & - & - & - & 0 & \infty & \infty \\ - & - & - & - & - & 0 & \infty \\ - & - & - & - & - & - & 0 \end{bmatrix}$$

The shortest-distance matrix D computed according to the algorithm steps is:

$$D = \begin{bmatrix} 0 & 5 & 6 & 16 & 10 & 8 & 8 \\ - & 0 & 1 & 11 & 15 & 3 & 3 \\ - & - & 0 & 10 & 16 & 4 & 2 \\ - & - & - & 0 & 8 & 14 & 12 \\ - & - & - & - & 0 & 18 & 18 \\ - & - & - & - & - & 0 & 6 \\ - & - & - & - & - & - & 0 \end{bmatrix}$$

Steps 1004 and 1005: by using the shortest-path matrix $P^{(k)}$ and the shortest-distance matrix $D^{(k)}$ between the sites within an effective area in the traveling wave network, which are obtained in the step 1003 by the computation, performing pairing computation with respect to the arrival time points of initial traveling wave and converting the positions of the possible disturbance points into the possible disturbance occurrence time points. In this example, according to the shortest-distance matrix D and the pairing computation method for the arrival time points of the initial traveling wave, the computation results can be converted into the possible disturbance occurrence time points, in which a matrix T of the possible occurrence time points of the fault is computed as:

$$T = \begin{bmatrix} 0 & 12.1 & 9.9 & 9.9 & 38.5 & 12.0 & 9.9 \\ - & 0 & 9.9 & 9.9 & 12.1 & 12.0 & 9.9 \\ - & - & 0 & 13.1 & 9.9 & 9.9 & 13.1 \\ - & - & - & 0 & 57.4 & 9.9 & 13.1 \\ - & - & - & - & 0 & 12.0 & 9.9 \\ - & - & - & - & - & 0 & 9.9 \\ - & - & - & - & - & - & 0 \end{bmatrix}$$

The data in T is grouped, and the average value of each group of data and the corresponding fault path are shown in Table 2.

TABLE 2 fault occurrence time and fault path

| group | element of matrix | average value/μs | fault path |
|---|---|---|---|
| 1 | $t^{13}, t^{14}, t^{17}, t^{23}, t^{24}, t^{27}, t^{35}, t^{36}, t^{46}, t^{57}, t^{67}$ | 9.9 | 2-3 |
| 2 | $t^{12}, t^{16}, t^{25}, t^{26}, t^{56}$ | 12.04 | 2-6 |
| 3 | $t^{34}, t^{37}, t^{47}$ | 13.1 | 3-7 |
| 4 | $t^{15}$ | 38.5 | 1-5 |
| 5 | $t^{45}$ | 57.4 | 4-5 |

The first three groups of the data with smaller average values are brought to the next step for computation.

Steps 1006 and 1007: obtaining the disturbance time data by extrapolation by the equal path length from the possible disturbance points, and computing and comparing the Manhattan distances between the data of the traveling wave acquisition points and actual records for determining the final disturbance point. In this example, the first three groups of the data with the smaller average values and the corresponding fault paths are used for fault ranging, and the Manhattan distances are computed for verification. The possible fault locations and the Manhattan distances are shown in Table 3.

TABLE 3 possible fault location and Manhattan distance

| fault | fault interval | fault location | Manhattan distance |
|---|---|---|---|
| $f_1$ | 2-3 | $L_{2f}$ = 405.3 m | 0.8 |
| $f_2$ | 2-6 | error in bus 2 | 12.86 |
| $f_3$ | 3-7 | error in bus 3 | 25.1 |

From Table 3, it can be found that the Manhattan distance computed according to the fault $f_1$ is the smallest one, so $f_1$ is most likely to be the fault point. The fault occurs in the path 2-3, and the distance from the fault point to the node 2 is 405.3 m.

When the fault occurs on the No. 1 DC bus, with setting the fault occurrence time is 0.01 ms and ignoring the propagation time of traveling wave on the bus, the arrival time of initial traveling wave of the fault recorded at each measuring point is shown in Table 4.

TABLE 4

Arrival time of initial traveling wave of fault

| node | time/μs |
|---|---|
| 1 | 10.0 |
| 2 | 36.3 |
| 3 | 41.6 |
| 4 | 94.4 |
| 5 | 62.7 |
| 6 | 52.2 |
| 7 | 52.2 |

According to the above steps, a matrix of the possible fault occurrence time is computed as:

$$T = \begin{bmatrix} 0 & 10.0 & 10.0 & 10.0 & 10.0 & 10.0 & 10.0 \\ - & 0 & 36.3 & 36.3 & 9.9 & 36.3 & 36.3 \\ - & - & 0 & 41.6 & 9.9 & 36.3 & 41.6 \\ - & - & - & 0 & 57.4 & 36.3 & 41.6 \\ - & - & - & - & 0 & 9.9 & 9.9 \\ - & - & - & - & - & 0 & 36.4 \\ - & - & - & - & - & - & 0 \end{bmatrix}.$$

The data of the grouping result is shown in Table 5.

TABLE 5 fault occurrence time and fault path

| group | element of matrix | average value/µs | fault path |
|---|---|---|---|
| 1 | $t^{12}, t^{13}, t^{14}, t^{15}, t^{16}, t^{17}, t^{25}, t^{35}, t^{56}, t^{57}$ | 9.96 | 1-2 |
| 2 | $t^{23}, t^{24}, t^{26}, t^{27}, t^{36}, t^{46}, t^{67}$ | 36.31 | 2-3 |
| 3 | $t^{34}, t^{37}, t^{47}$ | 41.6 | 3-7 |
| 4 | $t^{45}$ | 57.4 | 4-5 |

According to the grouping result in Table 5, the possible fault locations and Manhattan distances are computed, and the result is shown in Table 6.

TABLE 6 possible fault location and Manhattan distance

| fault | fault interval | fault location | Manhattan distance |
|---|---|---|---|
| $f_1$ | 1-2 | error in bus 1 | 0.24 |
| $f_2$ | 2-3 | error in bus 2 | 105.71 |
| $f_3$ | 3-7 | error in bus 3 | 147.8 |

From Table 6, it can be found that the Manhattan distance computed according to fault $f_1$ is the smallest one, so $f_1$ is most likely to be the location of the fault point and the fault occurs on the DC bus where the measurement point 1 is located.

The above descriptions are only better embodiments of the present invention, and do not serve as a restriction on the present invention for other forms. A person having ordinary skill in the art may use the above disclosed technical contents to vary or modify it into equivalent embodiment with equivalent variation. However, any simple variation, equivalent variation, and modification made to the above embodiments according to the substantial technology of the present invention, which is not divorced from the technical solution of the present invention, still belongs to the protection scope of the technical scheme of the present invention.

What is claimed is:

1. A method for determining a fault location in a direct current (DC) distribution line of a DC distribution network, wherein a main site and a plurality of acquisition sites are installed in the DC distribution network with the DC distribution line, the main site includes a processor executing machine instructions to implement the method, and each of the acquisition sites further includes a traveling wave signal detector and a time synchronization device, and is connected to the main site via a communication network, the method comprising:

step 1001: collecting and uploading a traveling wave signal detected by the traveling wave detector of each of the acquisition sites after a fault occurs in the line to the main site via the communication network, wherein the number of the acquisition sites is more than 2;

step 1002: collecting, by the processor of the main site, fault traveling wave data which is acquired by the traveling wave detector through each of the acquisition sites via the communication network, wherein the processor performs selection for generating a fault record set, and traveling wave records of acquisition sites are sorted out to generate the fault record set by taking traveling wave propagation times corresponding to the maximum distances between the acquisition sites of the DC distribution line as sorting values;

step 1003: defining, by the processor, an acquisition site where the traveling wave signal is first detected as a central acquisition site and then computing the shortest paths from the central acquisition site to other acquisition sites and their lengths, in the fault record set generated in the step 1002;

step 1004: using, by the processor, a shortest-path matrix $P^{(k)}$ and a shortest-distance matrix $D^{(k)}$ for the acquisition sites within an effective area in a traveling wave network, which are obtained by computation in the step 1003, for pairing computation with respect to arrival time points of initial traveling wave;

step 1005: converting, by the processor, positions of possible disturbance points into possible disturbance occurrence time points;

step 1006: extrapolating, by the processor, from equal path lengths of the possible disturbance points to obtain disturbance time data; and step 1007: computing and comparing, by the processor, Manhattan distances between traveling wave data of acquisition sites and actual records, so as to determine a final disturbance point, wherein the Manhattan distance of the final disturbance point is smallest and the location of the final disturbance point is determined as the fault location of the DC distribution line of the DC distribution network, such that an active inspection or an active maintenance regarding the fault location can be planned, so as to prevent a further DC distribution line fault.

2. The method for fault location of claim 1, wherein computing the shortest paths from the central acquisition site to other acquisition sites and their lengths in the step 1003 comprises:

step 1003-1: taking line lengths as weight to construct a weighted adjacency matrix A of a power network, and obtaining an initial distance-matrix $D^{(O)}=(d_{ij}^{(O)})=A$ and an initial shortest-path matrix $P^{(O)}=(a_{ij}^{(O)})$, where:

$$d_{ij}^{(0)} = \begin{cases} d_{ij}, & \text{where } i \text{ and } j \text{ are consecutive} \\ \infty, & \text{where } i \text{ and } j \text{ are non-consecutive} \end{cases} (i, j = 1, 2 \dots n);$$

$$a_{ij}^{(0)} = \begin{cases} \phi, & \text{where } i \text{ and } j \text{ are consecutive} \\ -, & \text{where } i \text{ and } j \text{ are non-consecutive} \end{cases} (i, j = 1, 2 \dots n);$$

step 1003-2: computing an iteration matrix $D^{(k)}=(d_{ij}^{(k)})$ and a shortest-path matrix $P^{(k)}=(a_{ij}^{(k)})$, where:

$$d_{ij}^{(k)} = \min \{d_{ij}^{(k-1)}, d_{ir}^{(k-1)} + d_{rj}^{(k-1)}\}, (r=1,2,\dots,n);$$

accordingly, if $d_{ij}^{(k)} = d_{il}^{(k-1)} + d_{lj}^{(k-1)}$, a site $v_l$ is recorded such that:

$$a_{ij}^{(k)}=\{a_{il}^{(k-1)}, v_{lj}a_{lj}^{(k-1)}\},$$

which indicates that a path length from a site $v_i$ to a site $v_j$ becomes shorter after passing by the site $v_l$, otherwise $a_{ij}^{(k)}=a_{ij}^{(k-1)}$; and step 1003-3: ending iteration if $D^{(k)}=D^{(k-1)}$.

3. The method for fault location of claim 1, wherein converting the positions of the possible disturbance points into the possible disturbance occurrence time points in the step 1005 is computed by a formula:

$$t_{fi} = T_a - \frac{X_{ABF}}{v} = \frac{1}{2}(T_a + T_d - T_{abcd})$$

where v is wave velocity along the line, $X_{ABF}$ is a distance from an acquisition site A to the fault point F; $T_a$ and $T_d$ are the arrival time points of the traveling wave recorded at the acquisition site A and an acquisition site D, $T_{abcd}$ is propagation time of the traveling wave passing by the acquisition sites A, B, C, D along a path, and $t_{fi}$ is a position of an i-th possible disturbance point figured out by computation.

4. The method for fault location of claim 1, wherein the pairing computation with respect to the arrival time points of the initial traveling wave is computed by:

bringing the arrival time points and the distances of the initial traveling wave of disturbance of two pairs of the acquisition sites into computation, so as to obtain a result set of the possible disturbance points, which is based on an expanded two-terminal traveling wave ranging principle;

wherein time points when an initial wavefront of the traveling wave arrives at acquisition sites A, B, C, and D are Ta, Tb, Tc, and Td, respectively, and a formula for computation is as follows:

$$\begin{cases} X_{ABF} = \frac{1}{2}[(T_a - T_d)\cdot v + L_{ABCD}] \\ X_{DCF} = \frac{1}{2}[(T_d - T_a)\cdot v + L_{ABCD}] \end{cases},$$

where $L_{ABCD}$ is the length of the line passing by the acquisition sites A, B, C, and D; v is wave velocity along the line; $X_{ABF}$ is a distance from the acquisition site A to the fault point F; $X_{DCF}$ is a distance from the acquisition site D to the fault point F, $T_a$ and $T_d$ are the arrival time points of the traveling wave recorded at the acquisition sites A and D.

5. The method for fault location of claim 1, wherein extrapolating from the equal path lengths of the possible disturbance points to obtain disturbance time data in the step 1006 comprises:

queuing and sorting out the possible occurrence time points of the disturbance, wherein the possible occurrence time points which have a time difference therebetween less than 3 us are regarded as the same time point, three earliest time points $t_{f0}$, $t_{f1}$, and $t_{f2}$ in the possible disturbance time points are taken as source vertices, such that three sets of traveling wave arrival record data of the traveling wave acquisition sites are obtained by extrapolation from the equal path length of each possible path.

6. The method for fault location of claim 5, wherein the computation process for obtaining the three sets of the traveling wave arrival record data of the traveling wave acquisition sites by extrapolation from the equal path length of each possible path comprises:

step 1006-1: defining an initial state of the DC distribution network graph as that all vertices have not been accessed and defining coloring values of all the vertices as being white so as to set a coloring value of the computed disturbance point F as gray;

step 1006-2, finding all adjacent vertices with white coloring values from a vertex with a gray coloring value, and comparing path lengths between the found adjacent vertices and the disturbance point F, wherein if a white vertex v which is adjacent to a vertex u having a gray coloring value at present satisfies:

$$d_{vF}=\min\{d_{iF}+d_{ij}\},(i=1,\ldots,n;j=1,\ldots,m),$$

the vertex v is colored as gray, wherein if there is no other white point adjacent to the vertex u, the coloring is gray and the arrival time point of propagation of the initial traveling wave of the disturbance is recorded, wherein n is the number of gray vertices, m is the number of white vertices corresponding to a gray vertex in the formula of the step 1006-2, and a cumulative path length from the vertices v to the fault point F is simultaneously recorded for the next search; and step 1006-3: repeating the step 1006-2 until all DC distribution network nodes are accessed.

7. The method for fault location of claim 1, wherein the Manhattan distances are computed by:

$$LM_k = \sum_{j=1}^{n} |t_{fij} - t_{rj}|,$$

where $t_{fij}$ is the arrival time point of the traveling wave at the j-th node obtained by extrapolation from the equal path length according to a source vertex which is set by the possible disturbance occurrence time point, and $t_{rj}$ is the arrival time point of the initial traveling wave of the disturbance recorded by a traveling wave acquisition site, wherein if a distance corresponding to a time difference of three or two earliest time points is less than 0.2 km, a bus is considered as a disturbance point.

* * * * *